(12) United States Patent
Hashimoto et al.

(10) Patent No.: US 6,426,744 B2
(45) Date of Patent: Jul. 30, 2002

(54) DISPLAY DRIVING APPARATUS HAVING VARIABLE DRIVING ABILITY

(75) Inventors: Yoshiharu Hashimoto; Katsumi Abe; Keiichi Yamamoto, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/152,068

(22) Filed: Sep. 11, 1998

(30) Foreign Application Priority Data

Sep. 12, 1997 (JP) .............................. 9-248559

(51) Int. Cl.$^7$ .......................... G09G 5/00; G09G 3/20
(52) U.S. Cl. ...................................... 345/214; 345/55
(58) Field of Search ................. 345/204–215, 345/87–104, 55; 349/40

(56) References Cited

U.S. PATENT DOCUMENTS

| | | | |
|---|---|---|---|
| 4,613,906 A | * | 9/1986 | Tanaka et al. ............. 358/183 |
| 4,660,030 A | * | 4/1987 | Maezawa ................... 345/91 |
| 5,070,255 A | * | 12/1991 | Shin ......................... 327/408 |
| 5,229,708 A | * | 7/1993 | Fuse .......................... 345/99 |
| 5,404,150 A | * | 4/1995 | Murata ....................... 345/95 |
| 5,455,534 A | * | 10/1995 | Motegi et al. ............. 327/544 |
| 5,497,146 A | * | 3/1996 | Hebiguchi ............. 340/825.91 |
| 5,517,212 A | * | 5/1996 | Inoue ........................ 345/211 |
| 5,583,528 A | * | 12/1996 | Ebihara ...................... 345/58 |
| 5,625,387 A | * | 4/1997 | Moon ........................ 345/211 |
| 5,663,743 A | * | 9/1997 | Fujii et al. ................. 345/95 |
| 5,745,092 A | * | 4/1998 | Ito ............................. 345/95 |
| 5,751,258 A | * | 5/1998 | Fergason et al. ............. 345/7 |
| 5,751,278 A | * | 5/1998 | Inamori et al ............. 345/211 |
| 5,793,342 A | * | 8/1998 | Rhoads ...................... 345/76 |
| 5,798,741 A | * | 8/1998 | Kajihara .................... 345/94 |
| 6,028,598 A | * | 2/2000 | Suyama et al. ............. 345/211 |

FOREIGN PATENT DOCUMENTS

| | | | |
|---|---|---|---|
| JP | 53-143194 | 12/1978 | |
| JP | 62-170992 | 10/1987 | |
| JP | 64-88494 | 4/1989 | |
| JP | 1-237697 | 9/1989 | |
| JP | 3-166589 | 7/1991 | |
| JP | 4-906 | 1/1992 | |
| JP | 4-14255 | 1/1992 | |
| JP | 4-271390 | 9/1992 | |
| JP | 4-316369 | 11/1992 | |
| JP | 5-81877 | 4/1993 | |
| JP | 5-323279 | 12/1993 | |
| JP | 6-149188 | 5/1994 | ............ G09G/3/36 |
| JP | 8-185144 | 7/1996 | |
| JP | 8-327973 | 12/1996 | |
| JP | 9-50259 | 2/1997 | ............ G09G/3/36 |

OTHER PUBLICATIONS

Korean Office Action dated Sep. 27, 2000, with Japanese translation and partial English translation.

* cited by examiner

Primary Examiner—Bipin Shalwala
Assistant Examiner—Jeff Piziali
(74) Attorney, Agent, or Firm—McGinn & Gibb, PLLC (57) ABSTRACT

A source driver according to the present invention is comprised of a bias circuit 2 and an output circuit 2. In the output circuit 21, a differential unit 21 amplifies the difference between two input signals received through input terminals. An output unit made up of the transistors, and a capacitor, receives a signal from the differential unit, amplifies it, outputting it to a liquid crystal display (not shown) via a variable-resistance unit with analog switches. A selection circuit causes each of the analog switches to be activated or deactivated. A bias current circuit changes a current flowing through a differential amplification circuit made up of the transistors. A bias current changing circuit changes a bias current flowing through a circuit made up of a transistor. A bias circuit receives an external voltage, exerting a control of the bias current flowing through respective bias current changing circuits. A bias voltage selection circuit changes a bias voltage output from the bias unit, and then sends it to the bias current changing circuits.

25 Claims, 5 Drawing Sheets

| C1 | C2 | CURRENT |
|---|---|---|
| 0 | 0 | 0 |
| 0 | 1 | 1i |
| 1 | 0 | 2i |
| 1 | 1 | 3i |

0:LOW
1:HIGH

Fig. 6

Fig. 7A  HEAVY LOAD

Fig. 7B  LIGHT LOAD

| C3 (S1) | C4 (S2) | RESISTANCE |
|---|---|---|
| 0 | 0 | INFINITE |
| 0 | 1 | R |
| 1 | 0 | 2R |
| 1 | 1 | 2/3R |

0:OFF
1:ON

DISPLAY DRIVING APPARATUS HAVING VARIABLE DRIVING ABILITY

BACKGROUND OF THE INVENTION

1. Field of the Invention

The present invention relates to a display driving apparatus, and particularly to a display driving apparatus having a variable driving ability.

2. Related Art

Figure 1:
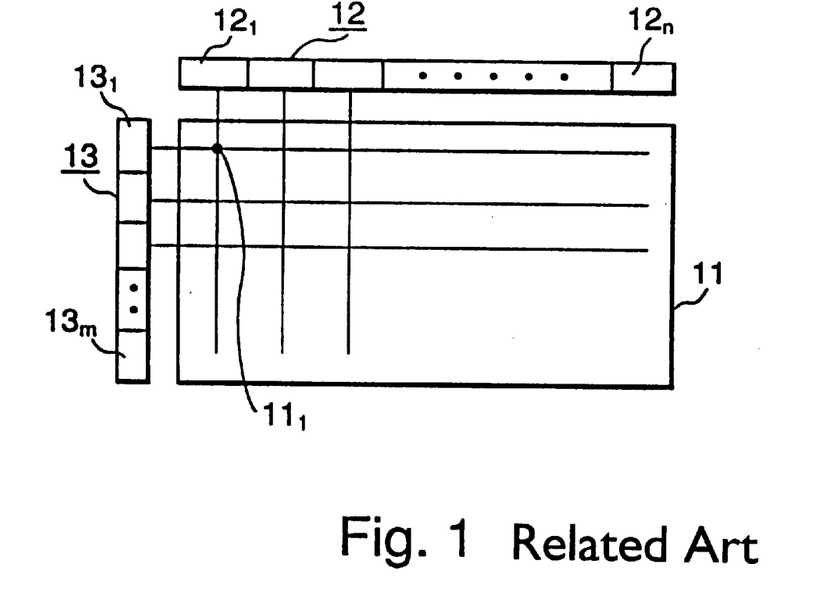
FIG. 1 shows the configuration of a liquid crystal display panel and its drivers.

FIG. 1 shows a general configuration of the conventional liquid crystal driving apparatus. As shown in FIG. 1, the conventional liquid crystal driving apparatus has a liquid crystal display 11, a source driver 12 made up of several drive units $12_1$ to $12_n$, each driving corresponding source electrodes in the liquid crystal display 11, and a gate driver 13 made up of several drive units $13_1$ to $13_n$, each driving units $13_1$ to $13_n$ driving gate electrodes in the liquid crystal display 11.

When a drive current is applied to the liquid crystal display 11 from one of the drive units $12_1$ to $12_n$, while also applying a drive voltage from one of the drive units $13_1$ to $13_n$, a corresponding pixel on the intersection of the applied drive current and the applied drive voltage will be activated.

Figure 2:
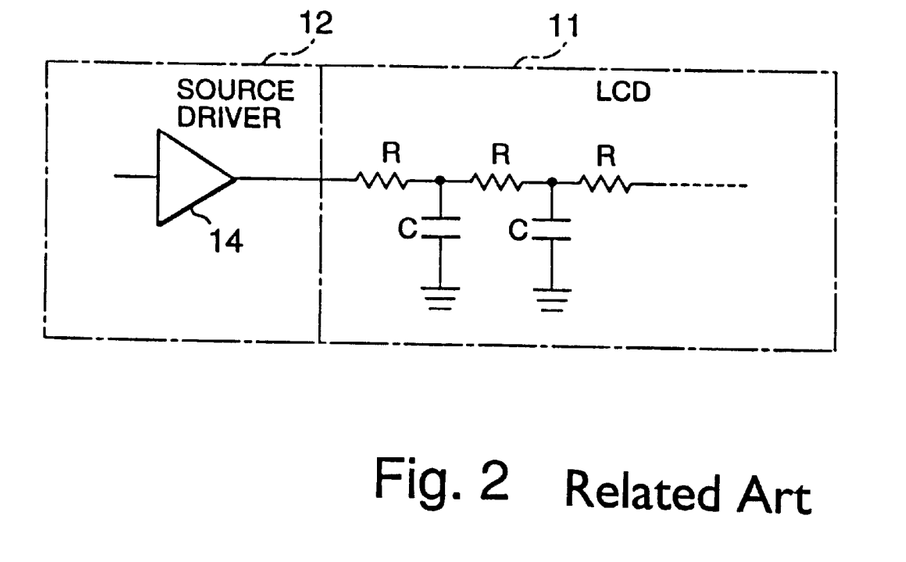
FIG. 2 shows an equivalent circuit to a liquid crystal display panel driven by a source driver.

FIG. 2 shows an equivalent circuit to the liquid crystal display 11, as an example. As shown in FIG. 2, the equivalent circuit is comprised of resistors R and capacitors C. Note that inductors (not shown) are also included in the liquid crystal display 11 in FIG. 2. A row of the liquid crystal display 11 is driven by a amplifier 14 prepared in the end of a source driver 12.

However, in the structure described earlier there are the following problems: the larger the liquid crystal display 11 becomes, the heavier its load becomes. In addition, the load of the liquid crystal display 11 may be uneven due to an error in its manufacturing process. A ringing noise may occur on the line of the liquid crystal display due to the negative characteristic of the amplifier 14 (e.g., caused by the feed back loop in the amplifier's structure) and the structure of the equivalent circuit shown in FIG. 2. This potential ringing noise cannot be prevented as long as the driving performance of the amplifier 14 is fixed and not flexibly changed in accordance with its error. Furthermore, when the liquid crystal display has a low amount of load to the drive performance of the amplifier 14, overshoot and undershoot noises may appear on the line driven by the amplifier 14. The ringing, overshoot, and undershoot noises cause an image degradation on the liquid crystal display.

SUMMARY OF THE INVENTION

Accordingly, an objection of the present invention is to provide a display driving apparatus and a display system which will effectively prevent the image degradation from occurring.

According to an aspect of the present invention, a display driving apparatus is provided, comprising: variable-resistor means through which a current is supplied for a data line of a display; and a selection means for selecting a resistance of the variable-resistor means. As an example, the variable-resistor means can be realized using analog switches S1 and S2 shown in FIG. 3, while the selection means can be realized by a selection circuit shown in the same.

According to another aspect of the present invention, the display driving apparatus further comprises current changing means for changing the aforementioned current. The current changing means can be realized with the combination of circuits 21 to 24, and a bias circuit 3 shown in FIG. 3.

Figure 9:
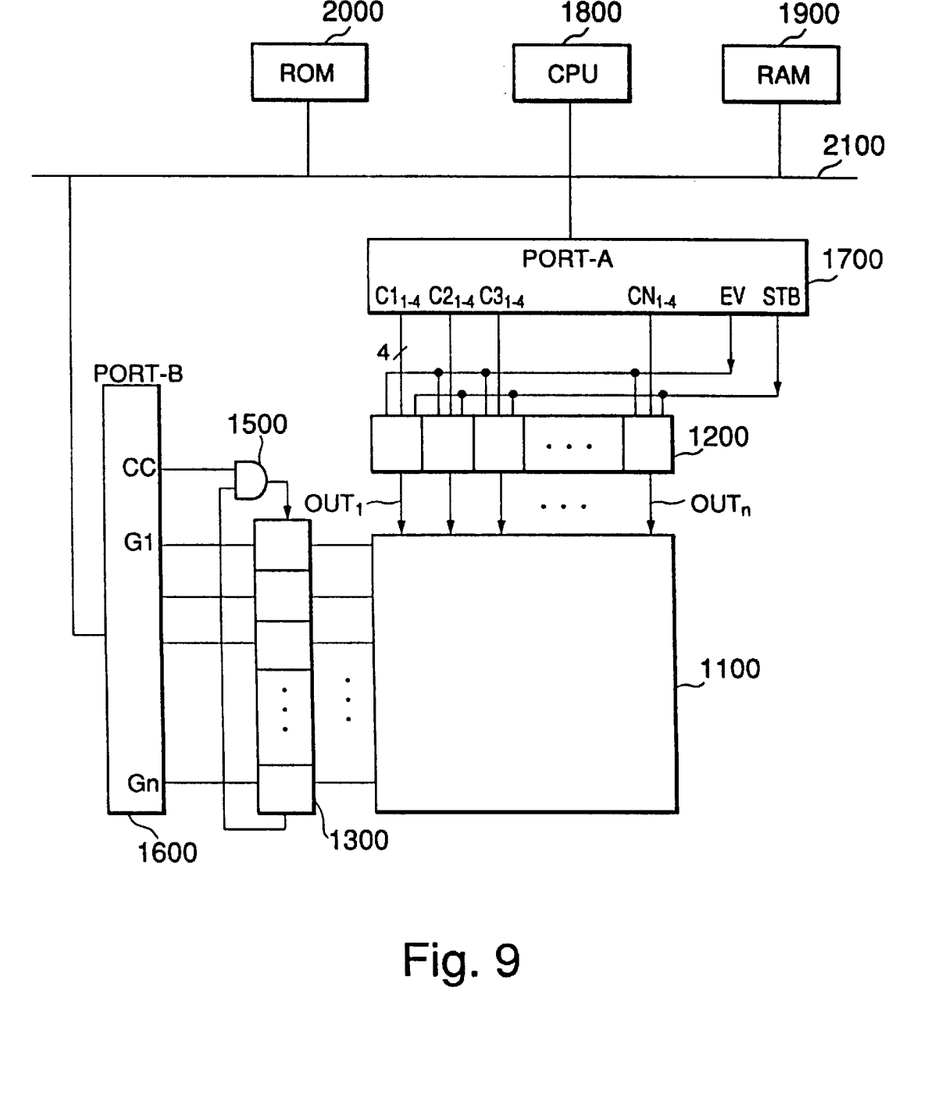
FIG. 9 show the circuit configuration of a display system according to the present invention.

According to yet another aspect of the present invention, a display system is provided, comprising: display means, comprised of a plurality of scanning lines and data lines, and a plurality of pixel cells(transistors) placed on the intersections of the plurality of scanning lines and the plurality of data lines, for displaying an image; data line driving means comprised of a plurality of source drivers, each driving each corresponding data line in the display means, wherein each source driver comprises variable-resistor means through which a current is supplied for each data line in the display means, and a selection means selecting a resistance of the variable-resistor means; and scanning line driving means for driving each scanning line in the display means. An exemplary structure of the display system is shown in FIG. 9. In this exemplary structure the display means corresponds to a display panel 1100; the data line driving means corresponds to the combination of a source driver 1200 and a port-A 1700; and the scanning line driving means corresponds to the combination of a gate driver 1300, an AND gate 1500, and a port-B 1600.

BRIEF DESCRIPTION OF DRAWINGS

Other features and advantages of the invention will be made more apparent through the detailed description hereafter, especially when taken in conjunction with the accompanying drawings, wherein.

DETAILED DESCRIPTION OF THE PREFERRED EMBODIMENTS

A liquid crystal display of a first embodiment according to the present invention will be described below in detail with reference to the drawings.

Figure 3:
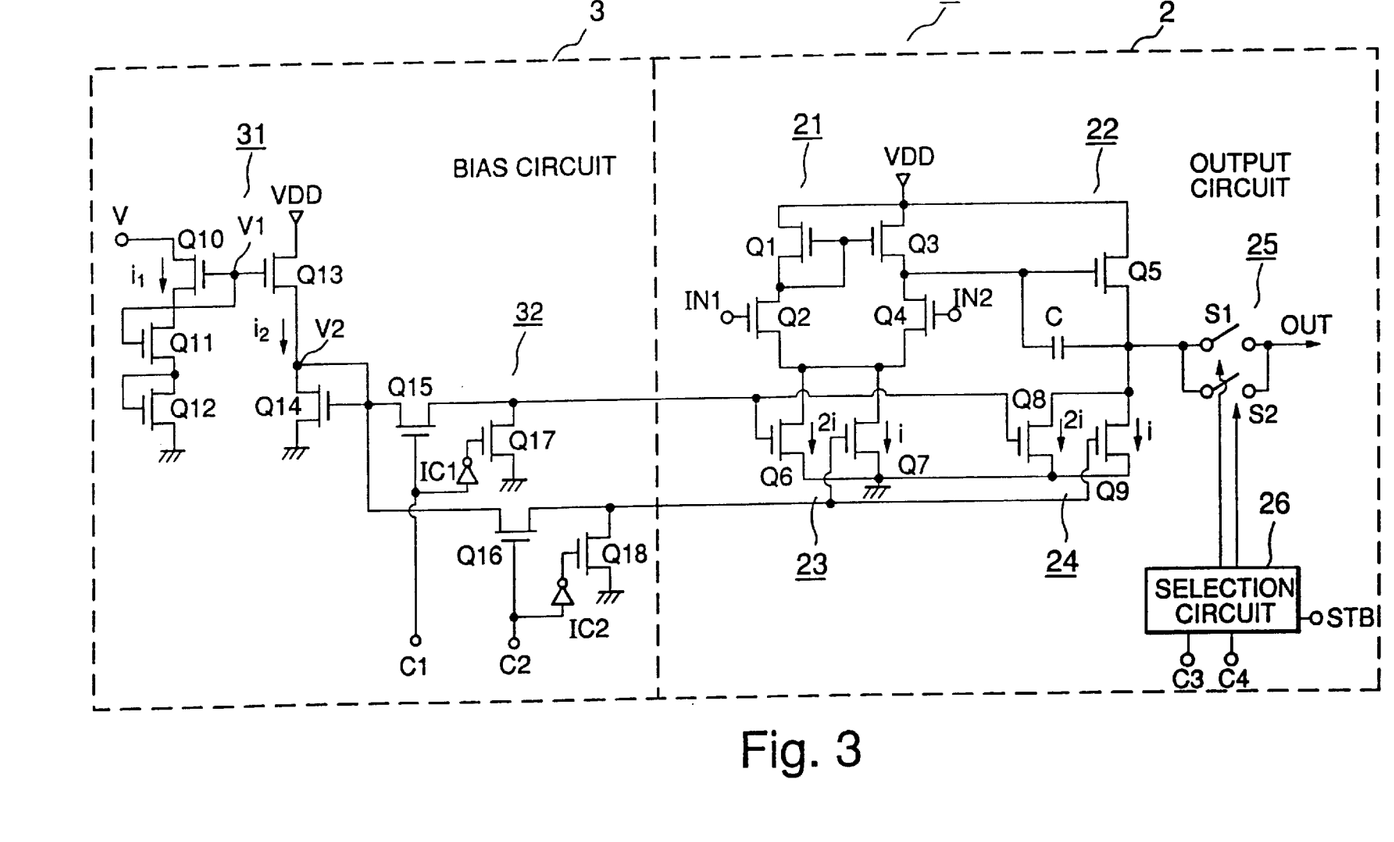
FIG. 3 shows an example circuit of a liquid crystal display driving circuit according to an aspect of the present invention.

FIG. 3 shows a circuit of the first embodiment; specifically, an exemplary configuration of the source driver driving the source electrodes of the liquid crystal display.

As shown in FIG. 3, a source driver 1 is comprised of: an output circuit 2 driving the source electrodes of the liquid crystal display from its output terminal OUT; and a bias circuit 3 providing a bias current for the output circuit 2.

The output circuit 2 is made up of field effect transistors Q1 to Q4, Q6 and Q7. Otherwise, from a functional viewpoint, it is comprised of: a differential unit 21 amplifying a difference between two input signals received from input terminals IN1 and IN2; an output unit 22 made up of transistors Q5, Q8, and Q9, and a capacitor C, receiving the amplified differential signal from the differential unit 21 and then driving a liquid crystal display(not shown); a variable-resistance unit 25, connected to the output unit 22, and also made up of analog switches S1 and S2 connected to each other in a parallel manner; and a selection circuit 26 causing each of the analog switches S1 and S2 of a variable-resistance unit 25 to be activated or deactivated. The differential unit 21 and the output unit 22 work in combination as an amplifier. In the differential unit 21, a bias current circuit 23, comprised of the transistors Q6 and Q7, plays a role of changing a bias current which flows through a differential amplification circuit made up of the transistors Q1 to Q4. In the output unit 22, a bias current changing circuit 24 comprised of transistors Q8 and Q9 changes a bias current flowing through a circuit made up of a transistor Q5 and a capacitor C.

A bias circuit 3 is comprised of: a bias unit 31 made up of transistors Q10 to Q14, receiving an external voltage V and exerting a control of a bias current flowing through a bias voltage selection circuit 32; and the bias voltage selection circuit 32, made up of transistors Q15 to Q18, which is also connected to the output side of the bias unit 31, changing a bias voltage output from bias unit 31, and then sending it to the bias current changing circuits 23 and 24.

Next, the operation of the source driver 1, structured in the same way as mentioned earlier, will be described below. In the bias circuit 3 generating a bias current which flows through the output circuit 2, when an external voltage is applied to the voltage terminal V of the transistor Q10 in the bias unit 31, all the transistors Q10 to Q12 are activated, causing a current ii to flow through the transistors Q10 to Q12. At this time, a current $i_2$, determined by both the voltage (VDD−V2) between the source and the drain of the transistor Q13, and the gate voltage V1, flows through the transistors Q13 and Q14. The voltage V2 is applied to the gates of bias current-variable circuits 23 and 24 in an output circuit 2, via the bias selection unit 32.

Voltages are applied via control terminals C1 and C2 to the gates of the respective transistors Q15 and Q16. When a "H" (High) level voltage is applied to the gate of the transistor Q15, via the control terminal C1, the transistor Q15 is activated. An inverted signal to the "H" level voltage is then sent to the gate of a transistor Q17 via an inverter IC1, causing the transistor Q17 to be deactivated. Accordingly, the voltage V2 in the bias unit 31 is applied to the gates of the respective transistors Q6 and Q8 in the output circuit 2, causing the transistors to be activated.

Application of a "H" level voltage to the gate of the transistor Q16, via the control terminal C2 causes the transistor to be activated. In this case, the inverted signal to the "H" level voltage is sent to the gate of the transistor Q18, causing the transistor to be deactivated. A "H" level voltage sent from the transistor Q13 in the bias unit 31 is applied to the gates of the transistors Q7 and Q9 in the output circuit 2, causing the transistors Q7 and Q9 to be activated.

Figure 4:
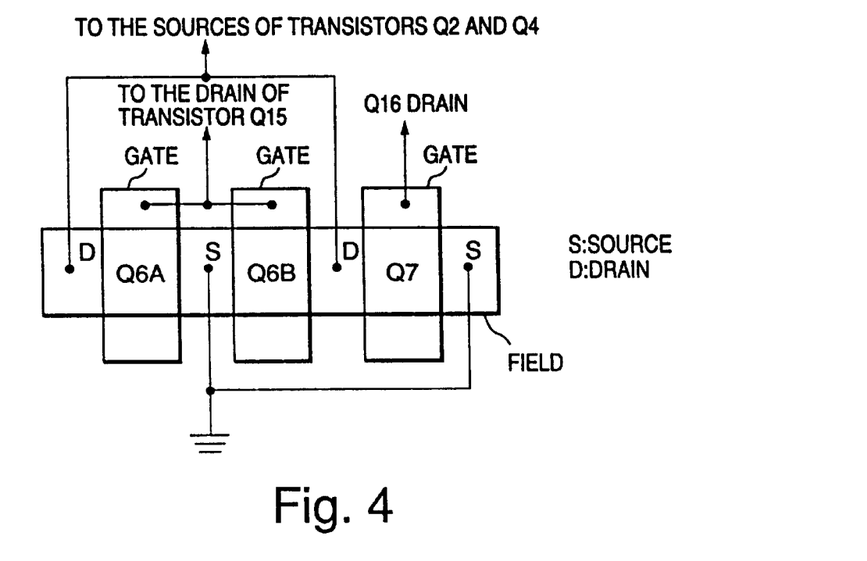
FIG. 4 shows a layout of a bias current-variable circuit 23.
Figure 5:
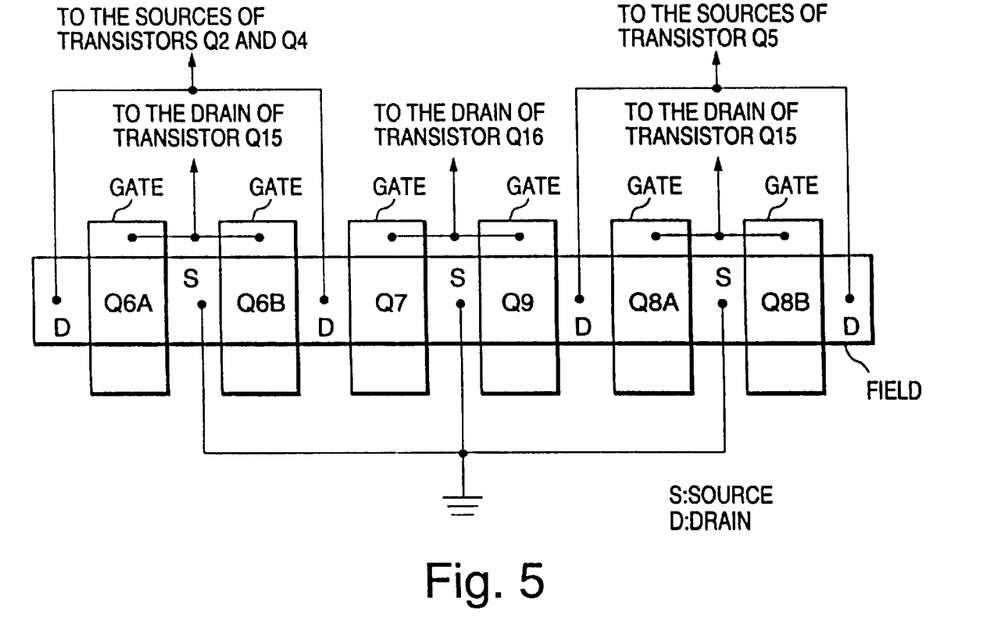
FIG. 5 shows a layout of bias current-variable circuits 23 and 24.

The bias current-variable circuit 23 changing a bias current, which flows through a differential amplification circuit of the differential unit 21 in the output circuit 2, gives weight to the bias current so that an on-current flowing through the transistor Q6 is controlled to be (2*i) for an on-current i of the transistor Q7. Note that the transistor Q6 can also be configured with two transistors Q6A and Q6B being connected to each other in a parallel manner, each having the identical on-current i, as shown in FIGS. 4 and 5. FIG. 4 shows a LSI configuration of the transistors Q6 and Q7 forming the bias current-variable circuit 23. They are fabricated in a smaller area by sharing a S(Source) or a D(Drain) diffused layer. FIG. 5 shows the configuration of the transistors Q6 to Q9 forming the bias current-variable circuits 23 and 24, fabricated on a LSI. They are also fabricated in a smaller area by sharing a S(source) or the D(Drain) diffused layer.

Referring back to FIG. 3, when a "H" level voltage is applied on the control terminal C2 in the bias circuit 3, the transistor Q7 is activated, causing a bias current i to be supplied for the differential amplification circuit of a differential unit 21. On the other hand, when the "H" level voltage is applied to the control terminal C1, the transistor Q6 is activated, causing a bias current 2*i to be supplied for the differential amplification circuit in the differential unit 21. Furthermore, when the "H" level voltage is applied to both the control terminals C and C2, both the transistors Q6 and Q7 are activated, causing a bias current 3*i to be supplied for the differential amplification circuit in the differential unit 21.

In the manner described earlier, the bias current-variable circuit 23 can change a bias current which flows through the differential amplification circuit (Q2 and Q4) in the differential unit 21.

The bias current-variable circuit 24 of the output unit 21 in the output circuit 2 operates in the same manner as the bias current-variable circuit 23 does. Specifically, when a "H" level voltage is applied to the control terminal C2 in the bias circuit 3, the transistor Q9 is activated, causing a bias current i to be supplied for the output unit 22. Conversely, when the "H" level voltage is applied to the control terminal C1, the transistor Q8 is activated, causing a bias current 2*i to be supplied for the output unit 22. Furthermore, when the "H" level voltages are applied to the respective control terminals C1 and C2, both the transistors Q8 and Q9 will be activated, causing a bias current 3*i to be supplied for the output unit 22.

Figure 6:
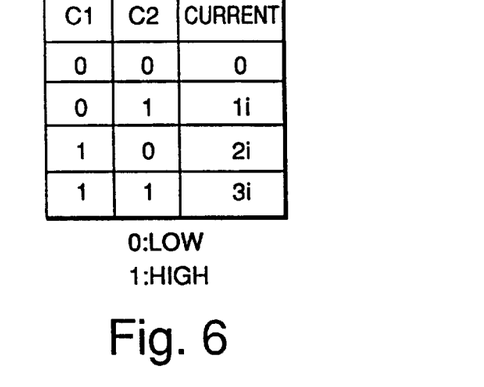
FIG. 6 is a function table showing the function of a bias selection circuit.

FIG. 6 is a function table showing the relation between the combination of the voltages applied to the respective control terminals C1 and C2, and the sum of the output currents flowing through the transistors Q6 and Q7 in the bias current-variable circuit 23, and also between the former and the sum of the output currents flowing through the transistors Q8 and Q9 in the bias current-variable circuit 24. Note that a "1" in the columns of C1 and C2 stands for an applied "H" (High) level voltage, while a "0" stands for an applied "L"(Low) level voltage.

Figure 7A:
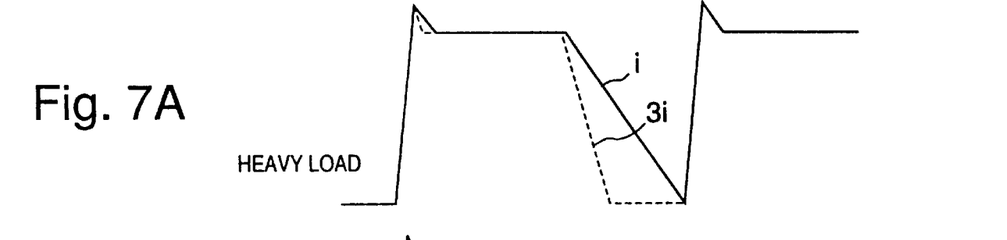
FIGS. 7A and 7B show wave forms output from an output circuit 2 for a heavy load and a light load, respectively.
Figure 7B:
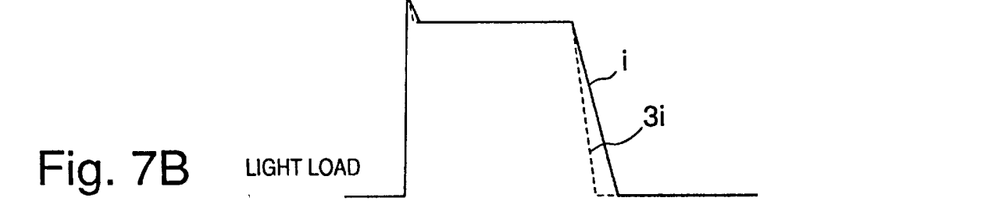

Next, FIGS. 7A and 7B show the wave forms output from the output circuit 2, corresponding to the different bias currents i and 3*i. Specifically, FIG. 7A shows the output wave form for a heavy load of a liquid crystal device (not shown) subsequently connected to the output circuit 2. Conversely, FIG. 7B shows the output wave form for a light load of the liquid crystal device.

As shown in FIGS. 7A and 7B, when the bias current of the output circuit 2 is large, regardless of an amount of the load of the liquid crystal display device, a target voltage is instantly achieved (which is shown by a broken line). Therefore, even though a ringing noise or a overshoot noise occurs on the output wave form, the target voltage is instantly achieved, enabling for successful display of an image on the liquid crystal device.

As described earlier, even though the amount of the load of a liquid crystal device connected to corresponding output circuit 2 varies widely, a changing of the bias currents flowing through the respective differential unit 21 and the output unit 22 in the output circuit 2, in accordance with the load amount of a liquid crystal device connected to the output unit 22, allows for the adapted provision of a corrected output current to the load. Therefore, a possible malfunction in a liquid crystal display due to a variance of the load is prevented.

Note that the bias current-variable circuit 24 changing the bias current of the output unit 22 in the output circuit 2 is prepared in this embodiment. Alternatively, a constant bias current can be also directly supplied to the output unit 22.

Furthermore, another structure for sending a bias current to the output circuit 2 can be made in such a way that changing the voltage of the voltage terminal V in the bias unit 31 of the bias circuit 3 also causes change in the output current of the transistor Q13, and the resulting output current is then sent to the differential unit 21 and the output unit 22 in the output circuit 2, as a bias current.

Next, as shown in FIG. 3, a variable resistance unit 25 comprised of analog switches S1 and S2 connected to each other in a parallel manner is prepared in the output side of the output unit 22. The output of the variable resistance unit 25 will be connected to a source electrode of the liquid crystal display.

In addition, a selection circuit 26 is prepared to control the analog switches S1 and S2, activating or deactivating each of them. The selection circuit 26 is controlled through control terminals C3 and C4, and a strobe terminal STB. The strobe terminal STB plays a role of determining the time period of activating the analog switches S1 and S2.

Figure 8:
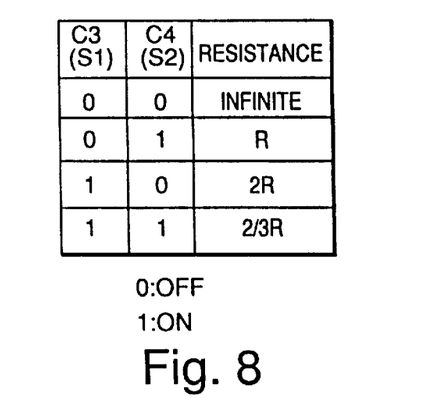
FIG. 8 is a function table showing the operation of variable resistors 25 and a selection circuit 26.

The function of the analog switches S1 and S2 is to adjust a drive capability in the output unit 22 for the liquid crystal display. The analog switches S1 and S2 have their own respective resistances composed of several number KΩ. They give weight to the currents flowing through them to route to the subsequent liquid crystal display, where they are activated. Specifically, as shown in FIG. 8, we assume that an on-resistance of the analog switch S3 in an on-state is 2R, while an on-resistance of the analog switch S4 is a half of 2R, namely, R. The synthesized resistance of the switches S1 and S2 is dependent upon whether or not they are activated. FIG. 8 shows the synthesized resistance of S1 and S2. Three resistances: R, 2R, and 2/3R are available when either the switch S1 or the switch S2 is activated. In FIG. 8, "1" denotes that the analog switch S1 is activated, while "0" denotes a deactivated state. When the analog switches S1 and S2 in the variable resistance unit 25 are both in the deactivated state, the synthesized resistance will equal infinity. When just the analog switch S2 is activated, the on-resistance will be the value of R. When just the analog switch S1 is activated, the on-resistance will be the value of 2R. Furthermore, when both the analog switches S1 and S2 are activated, the on-resistance will be the value of 2/3R.

Note that the analog switch S1 can be configured by two analog switches(S1A and S1B, not shown) connected to each other in series, each having identical resistance.

As described earlier, the use of the analog switches S1 and S2 with their respective resistances connected to each other in a parallel manner to the output unit 22, enables successful adjustment of the drive capability of the output unit 22 to the liquid crystal display.

Specifically, if a ringing noise is expected to occur on the output wave form of the output unit 22 due to a small amount of the liquid crystal display's load, either the analog switch S1 or the analog switch S2 needs to be activated, with the help of the selection circuit 26 with the voltages applied to its control terminals C4 and C3, resulting in the synthesized on-resistance of the variable-resistance unit 25 to be the value of 2R or R. Thus, the drive output of the output unit 22, controlled by the large on-resistance of the variable-resistance 25, will then be sent to the liquid crystal display, enabling for clear display.

If the pulse rise/fall time in the output wave form of the output unit 22 is expected to be late, the analog switches S1 and S2 need to be activated with the help of the selection circuit 26 with voltages applied to its control terminals C4 and C3, causing the synthesized on-resistance of the variable-resistance unit 25 to have the value of 2/3R. Thus, the drive capability of the output unit 22 is controlled through the on-resistance of the variable-resistance unit 25, and then sent to the liquid crystal display, enabling a clear display.

Note that another configuration without the bias current-variable circuits 23 and 24, and with the variable-resistance unit 25 can also prevent a faulty display by adjusting the resistance of the variable-resistance unit 25. In this case, a constant bias current is supplied for the differential amplifier 21 and the output unit 22 in the output circuit 2, from the bias circuit 3.

Result of the First Embodiment

As described above, according to an aspect of the present invention, a liquid crystal driving apparatus for driving a liquid crystal display with a plurality of scanning lines and data lines, achieved via a structure in which amplifiers are connected to the respective data lines, comprises a variable-resistance unit between the amplifier and each of the data lines. This enables fine adjustment of the resistance of the variable-resistance unit in accordance with the amount of a liquid crystal display's load, preventing a ringing noise and a pulse rise/fall time delay from occurring. Ultimately, it avoids a faulty display of an image on the liquid crystal display.

Furthermore, another liquid crystal driving apparatus of the first embodiment according to the present invention comprises a bias circuit 3 changing the bias current of the constant current source, and then sending the changed current t o the gate of MOS transistors(Q6, Q7, Q8, and Q9). the, the constant current source is made up of several MOS transistors(Q10, Q11, Q12, Q13, and Q14), and is also connected to the subsequent amplifier. Thus, the bias current of the amplifier can be changed in accordance with each liquid crystal display's load, so that a suitable drive current will be supplied to the liquid crystal display. Accordingly, a faultless image will be displayed on the liquid crystal display.

Second Embodiment

In a second embodiment, a display system using the aforementioned display driving apparatus of the first embodiment according to the present invention will be described below in detail.

FIG. 9 shows the configuration of a display system of the se cond embodiment according to the p resent invention. A liquid display 1100, driven by a source driver 1200 and a gate driver 1300, displays an image. The source driver 1200 is made up of several driving units, each being equivalent to the source driver 1 shown in FIG. 3. Each of the driving units of the source driver 1200 outputs a signal OUTi(i=1, 2, . . . , n) to activate a corresponding cell in the liquid crystal display 1100. The signal OUTi(i=1, 2, . . . , n) corresponds to a signal output from the output terminal OUT shown in FIG. 3. Each of the driving units of the source driver 1200 also receives control signals: EV, STB, and corresponding $Cn_{1-4}$ (n=1, . . . , n) from a port-A 1700. The control signal EV corresponds to the external voltage V shown in FIG. 3; the control signal STB the strobe signal STB shown in FIG. 3; and the $Cn_{1-4}$ (n=1, . . . , n) correspond to the signal from the control terminals C1 to C4 shown in FIG. 3.

The gate driver 1300 corresponding to gate driver 13 shown in FIG. 1, is a shift resistor made up of several gate drive units, each in turn giving the gates of corresponding row's transistors a given gate drive voltage in the liquid crystal display 1100. Before the liquid crystal display 1100 starts displaying an image, a logical "High" level data is output from an output terminal Gn (n=1, 2, 3, ..., n) in a port-A, and stored in one of the gate drive units in the gate driver 1300, causing for the activation of its corresponding row; other gate drive units are initialized into a logical "Low" level, preventing the activation of other respective row lines. The gate driver 1300 then starts the operation of shifting the appropriate stored data, whereby the last data is fed back to the beginning gate drive unit via an AND circuit 1500. Thus, the stored "High" level data circulates in the gate driver 1300, enabling driving of each row in the liquid crystal display 1100, in turn. The AND circuit 1500 receives an output from the last gate drive unit, and a circulation control signal from a circulation control terminal CC in the port-B, performing a logical AND operation and then outputting the resulting signal to the beginning gate drive unit in the gate driver 1300. During the period when a logical "High" level signal is sent from the circulation control terminal CC, the AND circuit 1500 always outputs the same signal as that output from the last gate drive unit, causing the calculation of all stored data in the respective gate drive units. On the other hand, during the period when a logical "Low" level signal is sent, the AND circuit 1500 always outputs a logical "Low" level signal, stopping the circulation of the "High" level data in the gate driver 1300.

As described above, a port-A 1700 sends the control signals EV, STB, and $Cn_{1-4}$ (n=1, ..., n) to the source driver 1200.

A CPU(Central Processing Unit) 1800 controls the whole display system shown in FIG. 9, by reading in and executing program codes stored in a ROM(Read Only Memory) 2000. The program codes are prepared in advance, delete of control of displaying an image on the liquid crystal display 1100. To successfully display a clear image, the program codes includes a given data for the control signals EV, STB, and $Cn_{1-4}$ (n=1, ..., n).

A RAM(Random Access Memory) 1900 is prepared for a working area used by the CPU to temporarily store display images, a variety of data necessary to execute program codes, and other related connections.

An interface bus 2100 is used to make a connection among the CPU, ROM, RAM, port-A, and port-B.

Incidentally, an available DSP(Digital Signal Processor) or graphic controller for exclusive use can be used to control the whole display system, in place of the CPU 1800.

Furthermore, note that the program codes can be stored in another recording medium such as a FD(Floppy Disk) and a HD(Hard Disk) in place of the ROM 2000, and then be read in and executed by the CPU 1800. To realize this operation, a recording medium control unit attached on the interface bus 2100 is necessary. Naturally, its implementation should be easily made by those skilled in the art.

In addition to the aforementioned operations according to the above embodiment which are realized by reading in and executing the program codes by the CPU 1800, the present invention allows for the event in which an OS(Operating System) or a similar system in the computer performs a part or the entire process in accordance with operations according to the above embodiment.

Further, the source driver 1 is comprised of MOS-type transistors in the aforementioned embodiments. Naturally, the source driver 1 can be made up of different types of transistors such as the bipolar-type transistors.

Furthermore, in the aforesaid embodiments, the display driving apparatus and the display system according to the present invention are both applied to the liquid crystal display. Naturally, they can also be applied to other displays such as the EL(ElectroLuminescence) and the PDP(Plasma Display Panel).

Note that many widely different embodiments of the present invention can be made without departing from the spirit and scope thereof. It should be understood that the invention is not limited to the specific embodiments described, except as defined in the appended claims.

What is claimed is:

1. A display driving apparatus for a display having a plurality of data lines, said apparatus comprising a plurality of driving units, each of said driving units being provided to drive an associated one of said data lines of said display, wherein each of said driving units comprises:

amplifier having an input node and an output node;

a variable-resistor circuit having a first end connected to the output end of said amplifier and a second end connected to said associated one of said data lines of said display; and a selection circuit selecting a resistance of the variable-resistor circuit.

2. The display driving apparatus according to claim 1, wherein said variable-resistor comprises a plurality of variable-resistance elements connected to one another in a parallel manner.

3. The display driving apparatus according to claim 2, wherein said comprising-resistance elements comprise comprise a plaurality of analog switches.

4. The display driving apparatus according to claim 3, wherein said analog switches comprise a plurality of metal oxide semiconductor (MOS)-type transistors.

5. The display driving apparatus according to claim 3, wherein said analog switches comprise a plurality of bipolar-type transistors.

6. The display driving apparatus according to claim 1, further comprising:

a current changing circuit for changing said current.

7. The display driving apparatus according to claim 6, wherein the current changing circuit comprises:

a constant-current source circuit for generating a constant current; and a current generation circuit for generating a plurality of different currents in accordance with selection signals and the constant current output from the constant-current source circuit.

8. The display driving apparatus according to claim 7, wherein said current changing circuit comprises a plurality of MOS-type transistors.

9. The display driving apparatus according to claim 7, wherein said current changing circuit comprises a plurality of bipolar-type transistors.

10. The display driving apparatus according to claim 7, wherein the constant current output from the constant-current source circuit is determined by an external voltage.

11. The display driving apparatus according to claim 4, wherein the plurality of MOS-type transistors have their drains or sources provided on the same diffused layer.

12. A display system, comprising:

a display circuit, comprised of a plurality of scanning lines and data lines, and a plurality of pixel cells placed on the intersection of the plurality of scanning line and the plurality of data lines, for displaying an image;

a data line circuit comprised of a plurality of source drivers, each driving each corresponding data line in the display circuit, wherein each source drive comprise an amplifier having an input and an output, a variable-resistor circuit connected between the output of the amplifier and each data line in the display circuit, and a selection circuit selecting a resistance of the variable-resistor circuit; and a scanning line driving circuit for driving each scanning line in the display circuit.

13. The display system according to claim 12, further comprising:

a current changing circuit for changing said current flowing through the variable-resistor circuit.

14. The display system according to claim 12, wherein the display circuit comprises a liquid crystal display.

15. The display system according to claim 12, wherein the display circuit comprises an Electro Luminescent (EL) display.

16. The display system according to claim 12, wherein the display circuit comprises a Plasma Display Panel (PDP).

17. A liquid crystal display driving apparatus which is to be used to drive a liquid crystal display with a plurality of scanning lines and a plurality of data lines, said apparatus comprising:

a plurality of amplifiers, each being provided for a corresponding one of said data lines; and a plurality of variable-resistance units, each having a first end connected to an output node of a corresponding one of said amplifiers and a second end connected to a corresponding one of said data lines.

18. The liquid crystal display driving apparatus according to claim 17, wherein the plurality of variable-resistance units are comprised of a plurality of analog switches.

19. The liquid crystal display driving apparatus according to claim 18, wherein the plurality of analog switches are comprised of a plurality of MOS-type transistors.

20. The liquid crystal display driving apparatus according to claim 18, wherein the plurality of analog switches are weighted.

21. The liquid crystal driving apparatus according to claim 18, wherein the plurality of analog switches are controlled by external digital input signals.

22. The liquid crystal driving apparatus according to claim 17, wherein each of the amplifiers comprises a constant-current source made up of a plurality of MOS transistors, which are connected to each other in a parallel manner, and a bias circuit changing the bias current flowing through the constant-current source is connected to the gates of the plurality of MOS-type transistors.

23. The liquid crystal driving apparatus according to claim 22, wherein the plurality of MOS-type transistors are weighted.

24. The liquid crystal driving apparatus according to claim 22, wherein the bias circuit is controlled by external digital input signals.

25. The liquid crystal driving apparatus according to claim 22, wherein a diffused layer is mutually used by the drains or the sources of the plurality of MOS-type transistors.

* * * * *